United States Patent
Kang

(10) Patent No.: US 7,802,537 B2
(45) Date of Patent: Sep. 28, 2010

(54) MASK FRAME ASSEMBLY FOR DEPOSITING THIN LAYER AND ORGANIC LIGHT EMITTING DISPLAY DEVICE MANUFACTURED USING THE MASK FRAME ASSEMBLY

(75) Inventor: Chang-Ho Kang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1025 days.

(21) Appl. No.: 11/176,282

(22) Filed: Jul. 8, 2005

(65) Prior Publication Data

US 2006/0012290 A1   Jan. 19, 2006

(30) Foreign Application Priority Data

Jul. 15, 2004   (KR)   ...................... 10-2004-0055074

(51) Int. Cl.
*B05C 11/11* (2006.01)
(52) U.S. Cl. .................................... 118/504
(58) Field of Classification Search .................. 118/504
See application file for complete search history.

(56) References Cited

U.S. PATENT DOCUMENTS

| | | | |
|---|---|---|---|
| 3,973,965 A * | 8/1976 | Suzuki et al. ................... | 430/5 |
| 6,255,775 B1 * | 7/2001 | Ikuko et al. .................. | 313/506 |
| 6,611,089 B2 * | 8/2003 | Kim et al. .................... | 313/407 |
| 6,664,183 B2 * | 12/2003 | Fukuzawa et al. ........... | 438/640 |
| 6,717,342 B2 * | 4/2004 | Kim et al. .................... | 313/402 |
| 6,720,720 B2 * | 4/2004 | Takei .......................... | 313/402 |
| 2002/0059903 A1 * | 5/2002 | Hasegawa et al. ........... | 118/504 |
| 2003/0101932 A1 | 6/2003 | Kang | |
| 2003/0180474 A1 * | 9/2003 | Nishikawa .................. | 427/468 |
| 2003/0221614 A1 * | 12/2003 | Kang et al. .................. | 118/504 |

FOREIGN PATENT DOCUMENTS

| | | |
|---|---|---|
| CN | 1674730 | 9/2005 |
| EP | 0892589 | 1/1999 |
| EP | 1093167 | 4/2001 |
| EP | 1115268 | 7/2001 |
| EP | 1426461 | 6/2004 |
| EP | 1 584 703 A1 | 10/2005 |
| EP | 1584703 | 10/2005 |
| JP | 2003217850 | 7/2003 |
| JP | 2004185832 | 7/2004 |

OTHER PUBLICATIONS

Chinese Office Action dated Jun. 20, 2008.
International Search Report Jun. 2005.

* cited by examiner

*Primary Examiner*—Michael Cleveland
*Assistant Examiner*—Keath T Chen
(74) *Attorney, Agent, or Firm*—H.C. Park & Associates, PLC

(57) ABSTRACT

A mask frame assembly for depositing a thin film including at least two unit masks, ends of the unit masks being coupled to a frame having an opening, and each unit mask includes a plurality of deposition openings. A first gap has a width substantially equal to a width of the deposition openings and is located between the unit masks.

10 Claims, 9 Drawing Sheets

MASK FRAME ASSEMBLY FOR DEPOSITING THIN LAYER AND ORGANIC LIGHT EMITTING DISPLAY DEVICE MANUFACTURED USING THE MASK FRAME ASSEMBLY

CROSS-REFERENCE TO RELATED APPLICATION

This application claims priority to and the benefit of Korean Patent Application No. 10-2004-0055074, filed on Jul. 15, 2004, which is hereby incorporated by reference for all purposes as if fully set forth herein.

BACKGROUND OF THE INVENTION

1. Field of the Invention

The present invention relates to a mask frame assembly and an organic light emitting display (OLED) device manufactured using the mask frame assembly, and more particularly, to a mask frame assembly for depositing a thin layer and an OLED device manufactured using the mask frame assembly.

2. Discussion of the Background

Generally, self-emissive OLED display devices are expected to be next generation display devices since they may have a wide viewing angle, high contrast, and high response speed.

Display devices may be inorganic light emitting display devices and OLED devices according to the material that forms the light emitting layer. The OLED devices are typically brighter than inorganic devices, and they have a higher response speed. Additionally, they can display color images.

The OLED device comprises a first electrode formed in a predetermined pattern on a substrate, an organic light emitting layer, which may be formed by vacuum evaporation, on the substrate having the first electrode, and a second electrode (cathode) formed in a direction crossing the first electrode on the organic light emitting layer.

The first electrode may be formed of indium tin oxide (ITO), and the ITO may be patterned using a photolithography method. In other words, the ITO may be patterned by wet etching with an etching solution including ferric chloride $FeCl_3$. However, if the second electrode is also etched using photolithography, moisture may penetrate a surface between the organic light emitting layer and the second electrode when exfoliating a resist and etching the second electrode, which reduces the OLED's performance and lifetime.

A method of depositing materials for forming an organic light emitting layer and a second electrode has been suggested to solve this problem.

To manufacture an OLED device using this deposition method, a stripe-shape first electrode formed of ITO is formed on a transparent insulating substrate using a photolithography method. After stacking an organic light emitting layer on the substrate having the first electrode, a mask having the same pattern as the second electrode is arranged contacting the organic light emitting layer, and a second electrode is formed by depositing a material for forming the second electrode.

Korea Laid-Open Patent Publication 2000-060589 discloses a mask for depositing the organic light emitting layer or the second electrode, an OLED device that uses the mask, and a method of manufacturing the OLED device.

The mask disclosed in Korea Laid-Open Patent Publication 2000-060589 has slots in a stripe shape spaced a predetermined distance from each other on a main body of a thin film.

A mask disclosed in Korea Laid-Open Patent Publication 1998-0071583 has a mesh shaped slit part and a bridge part on a metal thin film.

A mask disclosed in Japanese Patent laid-open Publication No 2000-12238 includes an electrode mask part and a pair of terminal mask units. The electrode mask part has a width corresponding to a gap between second electrode (i.e. cathodes), a plurality of marking parts in a stripe shape disposed parallel to each other, and a connection part that connects both ends of each marking part.

The conventional masks described above may not closely adhere to the substrate due to their weight even though a frame of the mask is tensioned to support an edge of a metal thin film in which long, stripe-shaped holes are formed. This problem is more severe as substrate size increases. Also, when the cathode is deposited, sagging due to the weight of the slot strips increases since heat applied to the mask causes it to expand.

FIG. 1 is an exploded perspective view showing a conventional mask used for mass production.

Referring to FIG. 1, masking pattern units 12 for depositing a plurality of unit substrates that form an OLED device are included on a metal thin film 11, and the mask is fixed to a frame 20 while applying tension to the mask.

The sagging problem of the conventional mask 10 may be more severe even though tension is uniformly applied to the frame 20 formed in a lattice shape since the mask 10 is large. In particular, a large metal thin film mask should be welded to the frame 20 so that a width of slots 12a formed on each of the masking pattern units 12 may be maintained within a tolerance range. If tension is applied to prevent the mask 10 from sagging, the welding within a tolerance range is difficult since a slot 12a pitch of each of the masking pattern units 12 may be deformed. If the slot 12a of the masking pattern units 12 of a particular portion of the mask 10 is deformed, a deformation force is applied to all neighboring slots. Therefore, the designed pattern deviates from a tolerance range since the slots 12a move relative to the substrate to be deposited. This problem arises in a vertical direction to the length direction of the slots 12a formed on the mask.

When each of the masking pattern units 12 is deformed, an accumulated deformation corresponding to absolute location errors between electrode pattern units formed on a substrate and the masking pattern units 12 increases. When the accumulated deformation increases, correct organic films of red, green, and blue color may not be formed on the electrode pattern units of the substrate. Hence, there is a limit to increase the size of the mask 10 since the control of pitch and total pitch of the masking pattern units 12 formed on a large metal thin film may be possible only in a very limited portion.

As FIG. 2 shows, when the mask 10 for one OLED device is fixed on the frame 20 by applying tension, the supporting bars 21 of both sides of the frame 20 may curve inward of the mask 10 and the upper and lower supporting bars 22 may bow outward, or, as FIG. 3 shows, both side supporting bars 21 may bow outward and the upper and lower supporting bars 22 may curve inward.

The deformations make it more difficult to control a total pitch difference between the masking pattern units 12 and the electrode pattern units formed on the substrate even if the mask 10 is welded to the frame 20 by applying uniform tension to the mask 10.

Japanese Patent Laid-Open publication 2001-247961 discloses a mask for solving a problem of creep deformation of strips that form slots due to thermal expansion of the mask. The disclosed mask is a deposition mask used for forming a patterning film by deposition on a substrate and includes a mask part having a plurality of barrier ribs that define first openings and a screen part in which a plurality of second openings, which have a smaller opening area than each first opening, include magnetic materials disposed on each of the first openings of the mask unit.

Japanese Patent Laid-Open publication 2001-273979 discloses a structure of a magnetic mask, and Japanese Patent Laid-Open publication 2001-254169 discloses a structure of a mask frame for masking a deposition region by adhering to a material to be deposited. The mask frame, on which a mask pattern corresponding to a deposition region is formed, includes a mask pattern having fine patterning units, which are supported by fine ribs.

These masks, however, do not solve the problems of sagging due to the mask's weight, of deformation of pitch between the strips due to tension applied to the mask, and of variation of total pitch caused by internal stress of the mask and the frame even though the mask is closely adhered to a material to be deposited by forming a magnetic body.

Additionally, Japanese Patent Laid-Open publication 2002-235165 and U.S. Pat. No. 3,241,519 disclose masks for preventing thermal deformation of openings and improving precision. A mask in which a plurality of unit patterns are formed on a single frame and mask for a large display pattern has been disclosed in European Patent Laid-Open Publication EP 1,209,522 A2, and similar masks have been disclosed in U.S. Published Application No. 2002/0025406 A1, now U.S. Pat. No. 6,898,709. However, these masks also have the same problems described above.

Also, European Patent Laid-Open Publication EP 1,229,144 A2 discloses a mask frame assembly in which a plurality of masks are supported by a single frame having openings corresponding to each of the masks. However, this mask may waste substrate to be deposited due to the limitation of reducing gaps between masks, and the fabrication of masks is complicated. Therefore, this mask may not be suitable for forming a large size display pattern.

Applicant's Korean Patent Publication 2003-0046090 discloses a mask frame assembly to solve the above problems.

The mask includes at least two unit masks on which at least one masking pattern unit is formed in a length direction of the mask. However, a gap between the unit masks can be hardly reduced.

SUMMARY OF THE INVENTION

The present invention provides a mask frame assembly for depositing a thin film by which a total pitch between deposited patterns may be easily controlled and a deposited pattern deformation due to the increase in a size of masking pattern units may be reduced.

The present invention also provides a mask frame assembly for depositing a thin film permitting a display having increased size and resolution.

The present invention also provides an OLED device that has a high precision pitch between pixels, displays high quality images, and has a large screen.

Additional features of the invention will be set forth in the description which follows, and in part will be apparent from the description, or may be learned by practice of the invention.

The present invention discloses a mask frame assembly for depositing a thin film, including at least two unit masks, where ends of the unit masks are coupled to a frame having an opening. Each unit mask includes a plurality of deposition openings. A first gap having a width substantially equal to a width of the deposition openings is located between the unit masks.

The present invention also discloses an OLED device including a plurality of first and second electrodes facing each other and formed on a substrate, and an EML arranged between the first and second electrodes. The EML includes at least one continuous stripe pattern and a plurality of discontinuous dot patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

The present invention will now be described more fully with reference to the accompanying drawings showing exemplary embodiments of the invention.

Figure 1:
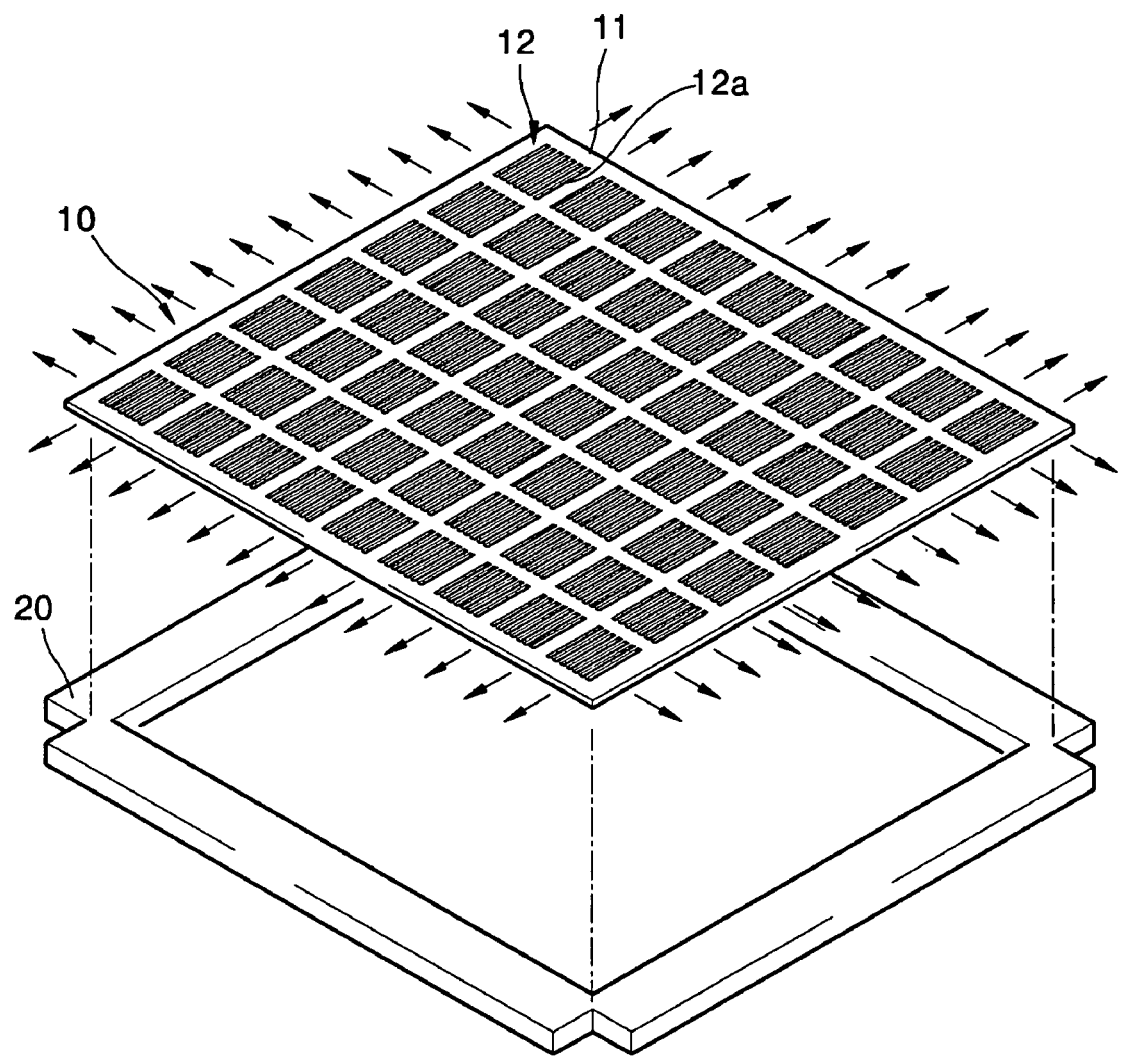
FIG. 1 is an exploded perspective view showing a conventional OLED device.
Figure 2:
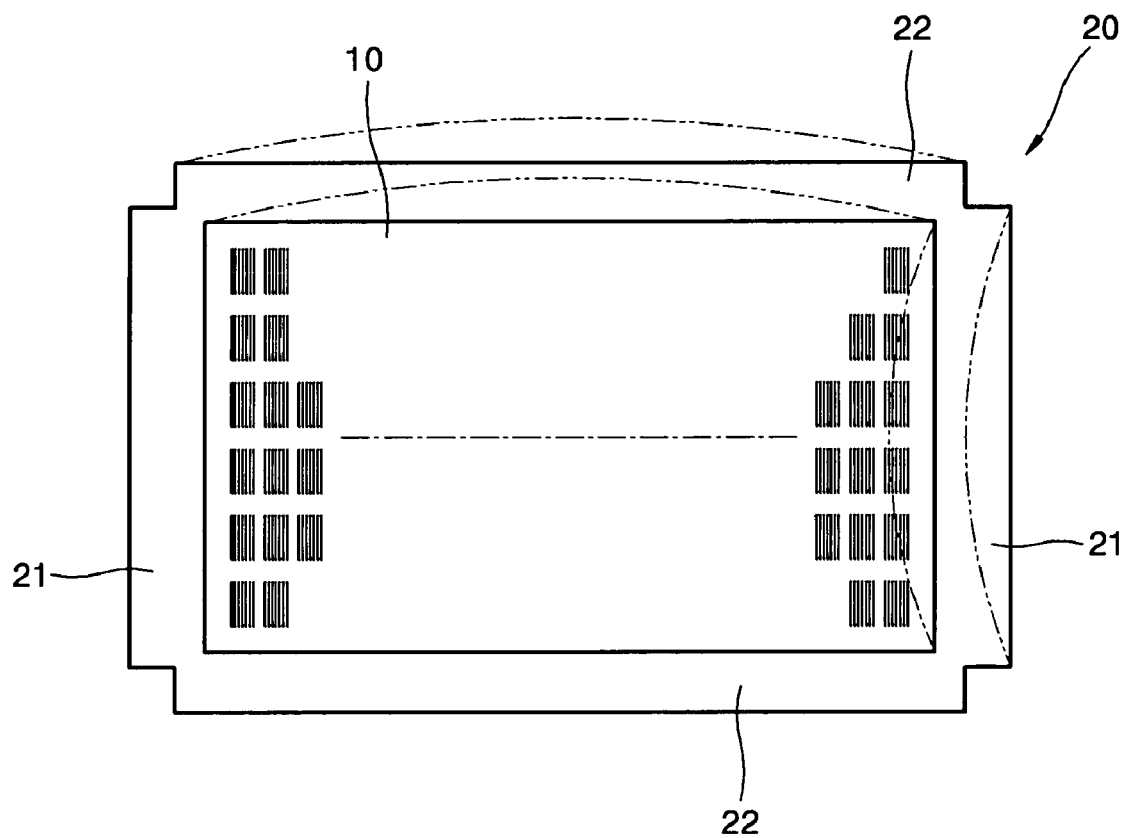
FIG. 2 and FIG. 3 are plan views showing conventional mask frame assemblies.
Figure 3:
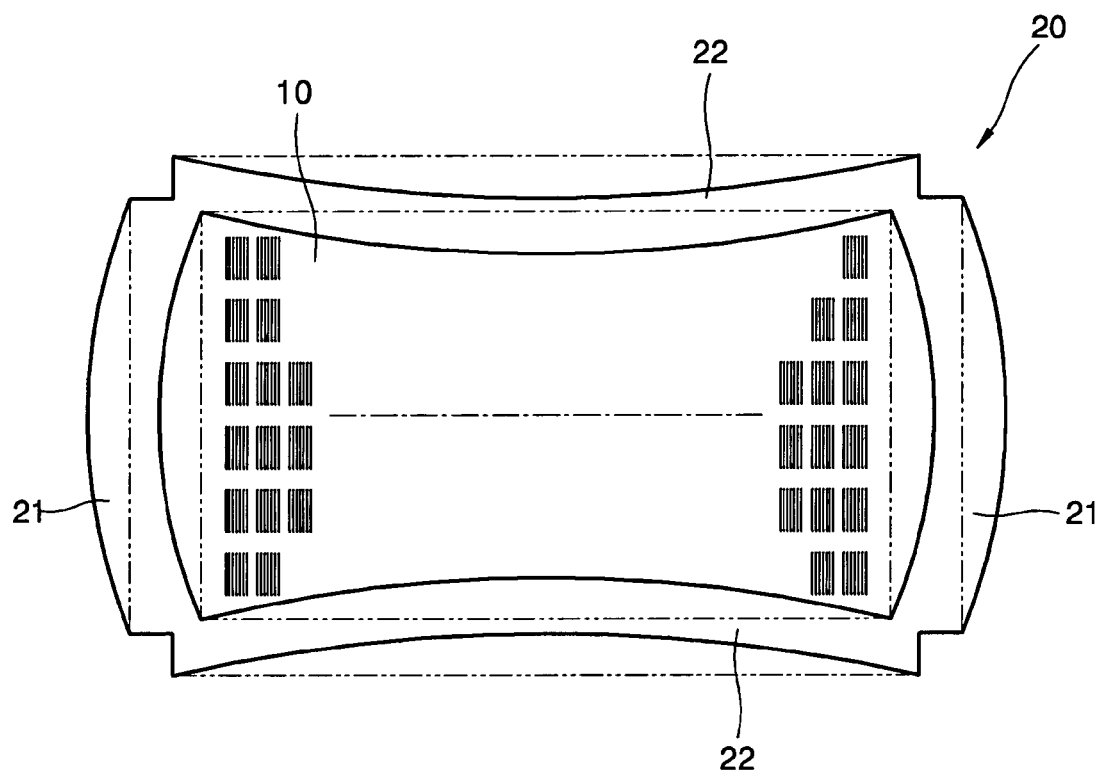
Figure 4:
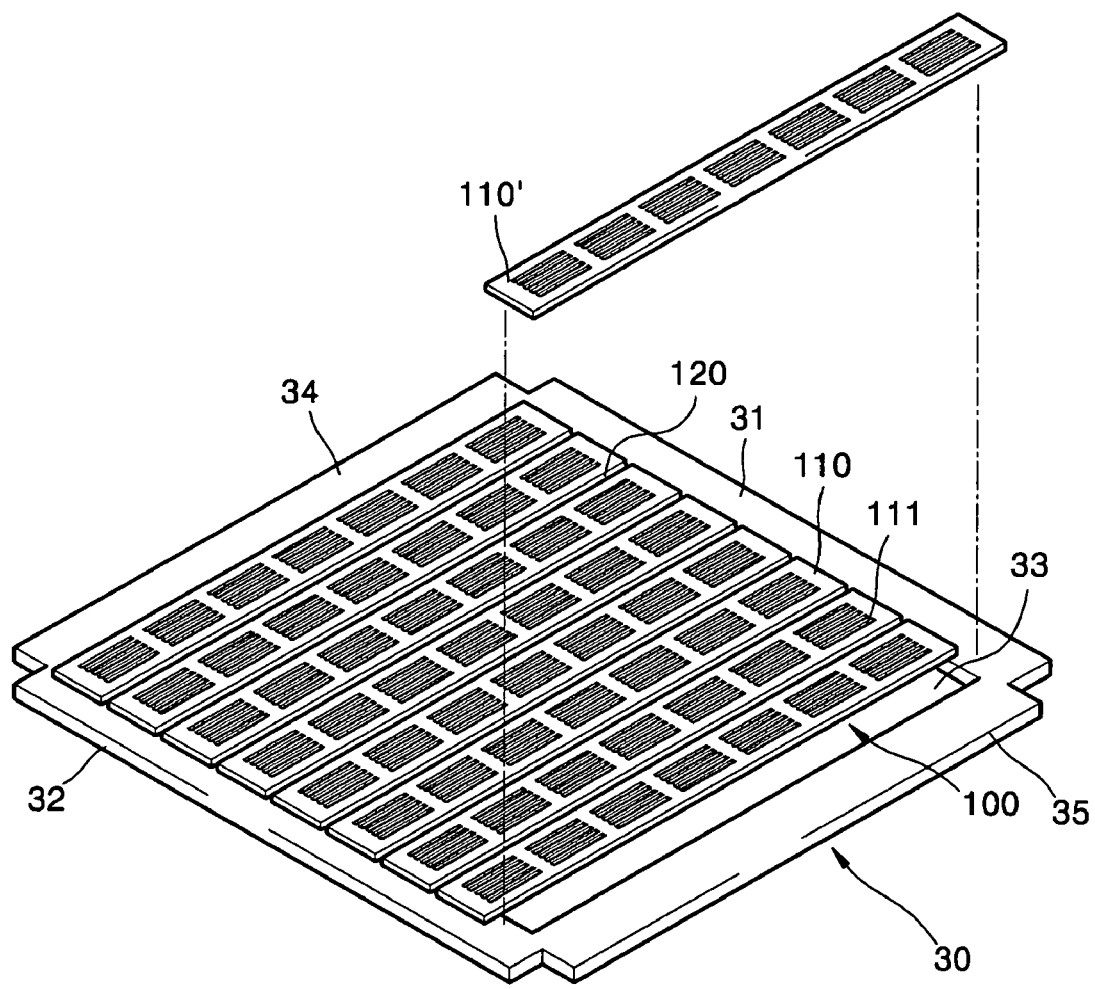
FIG. 4 is an exploded perspective view showing a mask frame assembly for depositing a thin film of an OLED device according to an embodiment of the present invention.
Figure 5:
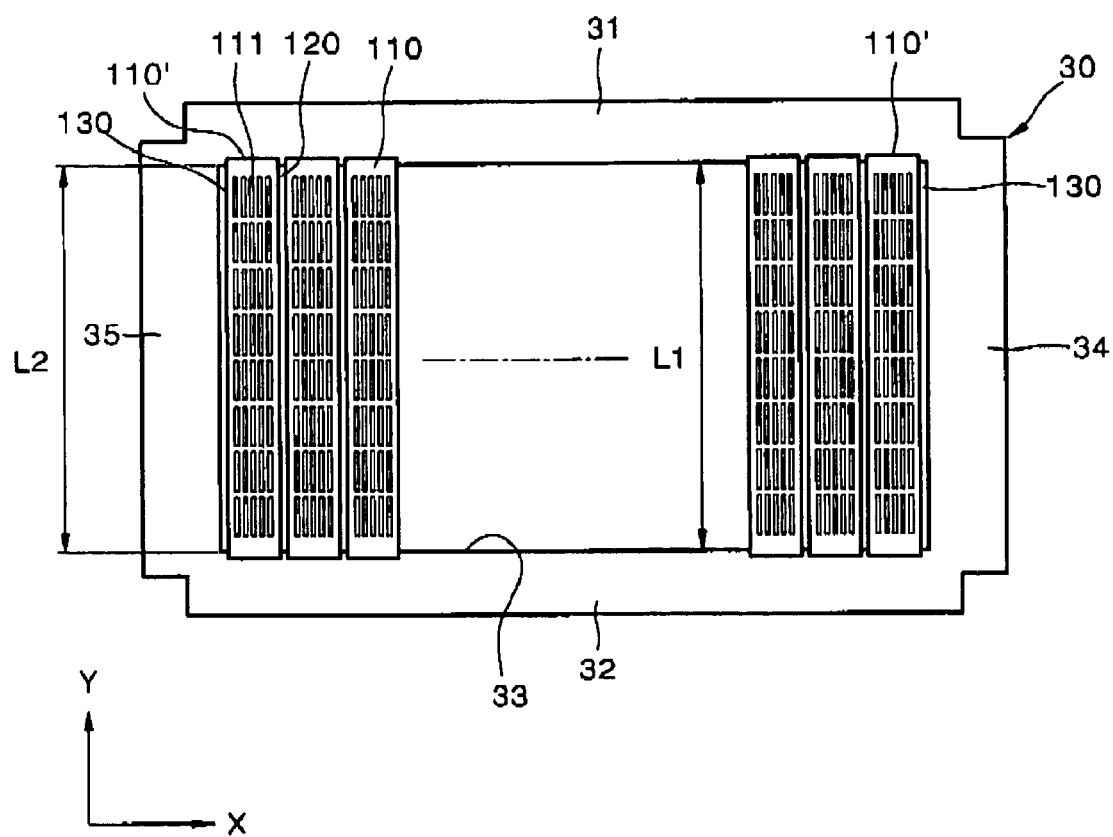
FIG. 5 is a plan view showing the mask frame assembly of FIG. 4.

FIG. 4 is an exploded perspective view showing a mask frame assembly for depositing a thin film of an OLED device according to an embodiment of the present invention, and FIG. 5 is a plan view of the mask frame assembly of FIG. 4.

Referring to FIG. 4 and FIG. 5, the mask frame assembly comprises a frame 30 and unit masks 110 and 110', and the frame 30 supports both ends of the unit masks 110 and 110'. The unit masks 110 and 110' constitute a mask 100, where unit masks 110' denote outermost unit masks of the mask 100.

The frame 30 includes first supporting units 31 and 32 arranged substantially parallel to each other and second supporting units 34 and 35 that form a rectangular opening 33 by connecting to ends of the first supporting units 31 and 32. The second supporting units 34 and 35 are arranged substantially parallel to the unit masks 110 and 110' and may be formed of an elastic material, but are not limited thereto. The first supporting units 31 and 32 and the second supporting units 34 and 35 may be formed in one body.

The frame 30 is strong enough to support the unit masks 110 and 110'.

The frame 30 may have any structure that does not interrupt the adherence between a material to be deposited and the mask.

As described above, the mask 100 includes at least two unit masks 110 and 110'.

Each unit mask 110 and 110' is formed in a thin film strip, and deposition openings 111 are formed in a length direction of the unit masks 110 and 110' at a predetermined distance from each other.

The mask 100 composes a masking pattern by the deposition openings 111. That is, each deposition opening 111 has a size corresponding to the size of a sub-pixel. As FIG. 4 and FIG. 5 show, the deposition openings 111 may be a discontinuous dot pattern, or, although not shown, a continuous stripe pattern.

The unit masks 110 and 110' may be a magnetic thin film formed of nickel or a nickel alloy. Further, the unit masks may be formed of a nickel-cobalt alloy which has a good surface roughness and may be easily formed in a fine pattern.

The fine patterning and superior surface flatness of the unit masks 110 and 110' may be obtained by forming the deposition openings 111 using an electro forming method. Also, the fine patterning and superior surface flatness of the unit masks 110 and 110' may be obtained by etching a thin film on which a resist layer having an identical pattern to the deposition openings 111 using a photoresist is formed or a film having an identical pattern to the deposition opening 111 is attached.

Both ends of the unit masks 110 and 110' may be bonded or welded to the frame 30 while applying tension in the Y axis direction of FIG. 4. At this time, the deposition openings 111 for depositing of the unit masks 110 and 110' are located within the openings 33. The unit masks 110 and 110' and the frame 30 may be bonded by an adhesive or welded using laser welding or resist heated welding, but laser welding may be preferred given its precision.

According to an embodiment of the present invention, a first gap 120 exists between the unit masks 110 and 110'.

Figure 6:
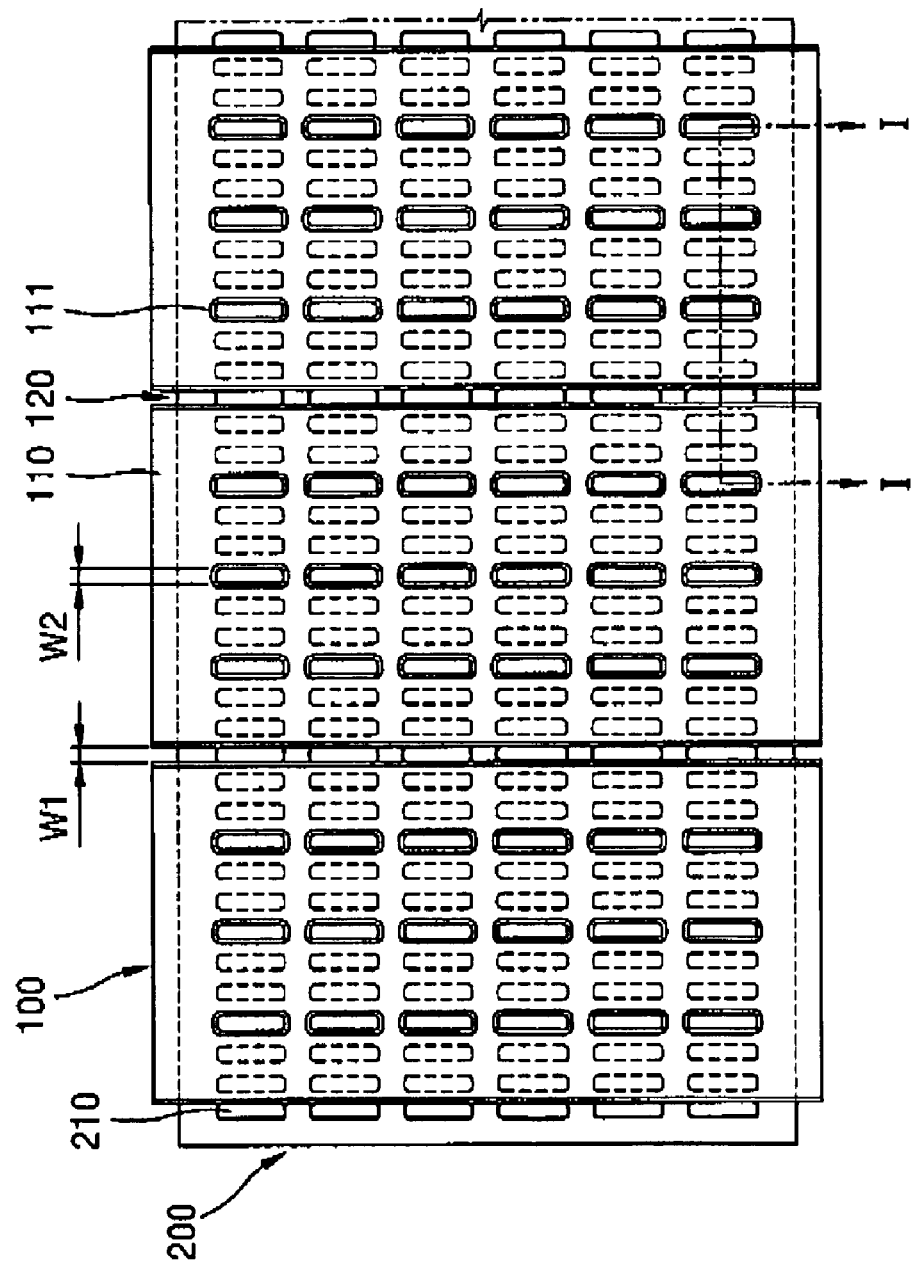
FIG. 6 is a plan view showing sub-pixels of the OLED device formed using the mask frame assembly of FIG. 4.

As FIG. 6 shows, a width W1 of the first gap 120 is substantially equal to the width W2 of the deposition openings 111 of the unit mask 110. Accordingly, the product to be deposited may be patterned by the first gap 120 to have substantially the same width as that patterned by the openings 111.

FIG. 6 is a plan view showing sub-pixels of the OLED device formed using the mask frame assembly of FIG. 4.

Referring to FIG. 6, in the mask frame assembly according to an embodiment of the present invention, a plurality of sub-pixels 210 of a single color may be deposited. Therefore, when the sub-pixels 210 have red, green, and blue color, one deposition opening 111 corresponds to one sub-pixel 210.

At this time, a product to be deposited may be patterned by the first gap 120 to have the same width as that patterned by the deposition openings 111.

Therefore, a width W1 of the first gap 120 equals the width W2 of the deposition openings 111. Also, a cross-sectional structure of the first gap 120 is the same as a cross-sectional structure of the deposition openings 111 as shown in FIG. 7, which is a cross-sectional view of the mask 100 taken along line I-I of FIG. 6.

Figure 7:
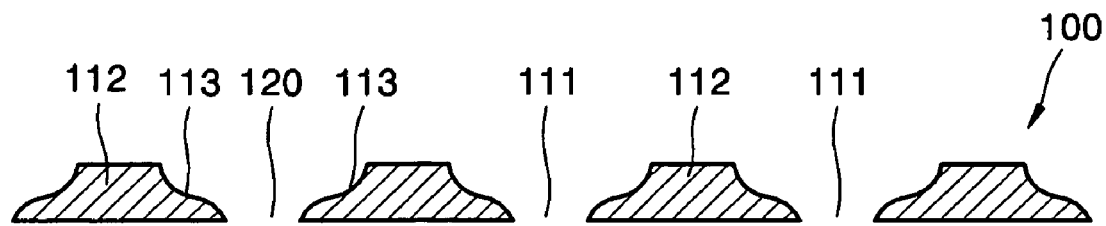
FIG. 7 is a cross-sectional view taken along line I-I of a unit mask of FIG. 6.

In FIG. 7, a lower part of the mask 100 indicates a portion to which a substrate is closely adhered and an upper part of the mask 100 indicate portions at which deposition vapors arrive from a deposition source. In this case, a sloped taper is formed on a shielding part to reduce a shadow effect. In other words, in each unit mask 110 and 110', a sloped taper is formed on shielding parts 112. The same taper is formed on end parts 113, which are vertical to the length direction of the unit mask 110, so that the deposition openings 111 and the first gap 120 have the same cross-sectional structure.

As FIG. 5 shows, the first gap 120 extends along a length direction of the unit mask 110. The length L1 of the first gap 120 may substantially equal a length of the unit mask 110 exposed in the opening 33 of the frame 30. That is, as shown in FIG. 5, a distance between the first supporting units 31 and 32 facing each other may be substantially equal to the length L1 of the first gap 120.

As FIG. 5 shows, in an embodiment of the present invention, a second gap 130 may be located between each outermost unit mask 110' and the frame 30.

The second gap 130, like the first gap 120, may also be used to deposit the sub-pixels 210. Therefore, even though it is not shown in the drawing, the second gap 130 may have substantially the same width and cross-sectional structure as the deposition openings 111.

As FIG. 5 shows, the second gap 130 extends along the length direction of the unit mask 110'. The length L2 of the second gap 130 may be substantially equal to the length of the unit mask 110' exposed in the opening 33 of the frame 30. That is, as shown in FIG. 5, a distance between the first supporting units 31 and 32 facing each other may be substantially equal to the length L2 of the second gap 130.

Figure 8:
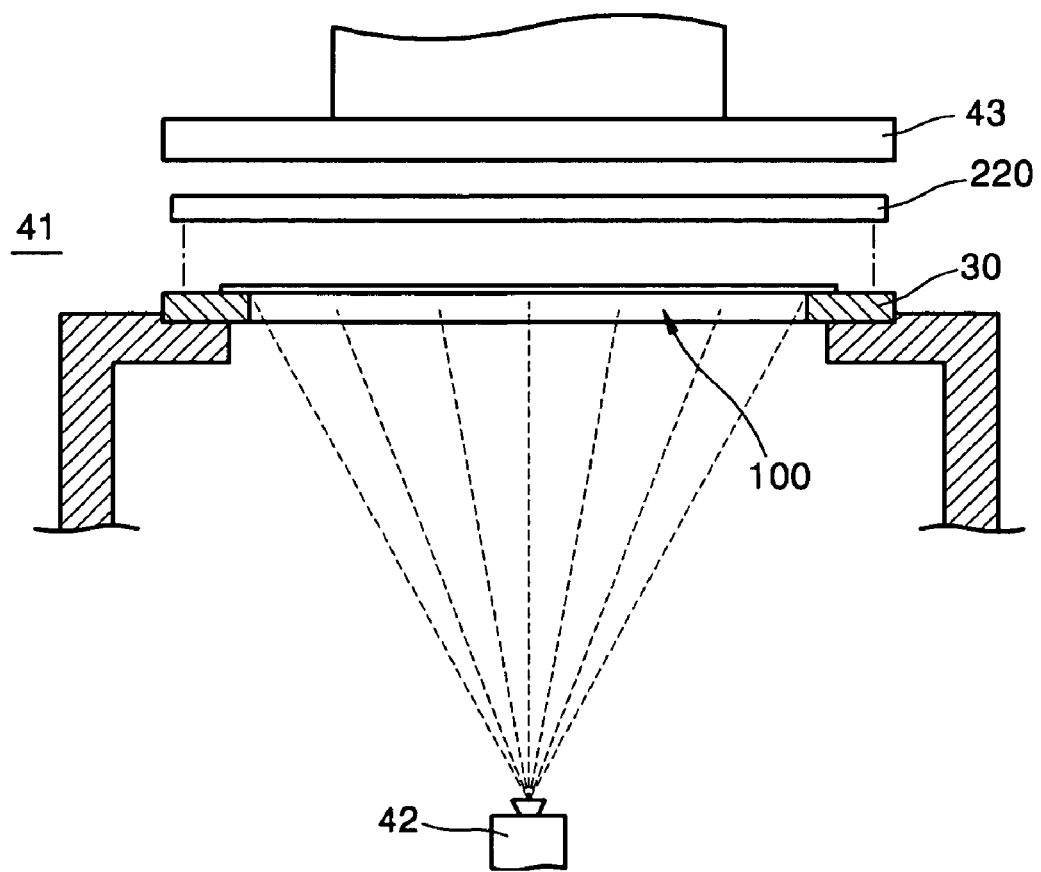
FIG. 8 is a cross sectional view showing an apparatus for depositing an organic film on a substrate.

Deposition may be performed with the mask frame assembly for depositing a thin film according to an embodiment of the present invention by mounting it on a deposition apparatus shown in FIG. 8.

Referring to FIG. 8, to deposit thin films of an OLED device, such as red, green, and blue organic light emitting layers, a mask frame assembly is mounted on a side corresponding to an organic film deposition crucible 42 disposed in a vacuum chamber 41, and a substrate 220 on which a thin film will be formed is arranged on the mask frame assembly. Next, the mask 100 is closely adhered to the substrate 220 by driving a magnet unit 43. An organic material placed on the organic film deposition crucible 42 may be vaporized by driving the organic film deposition crucible 42 and deposited on the substrate 220.

Figure 9:
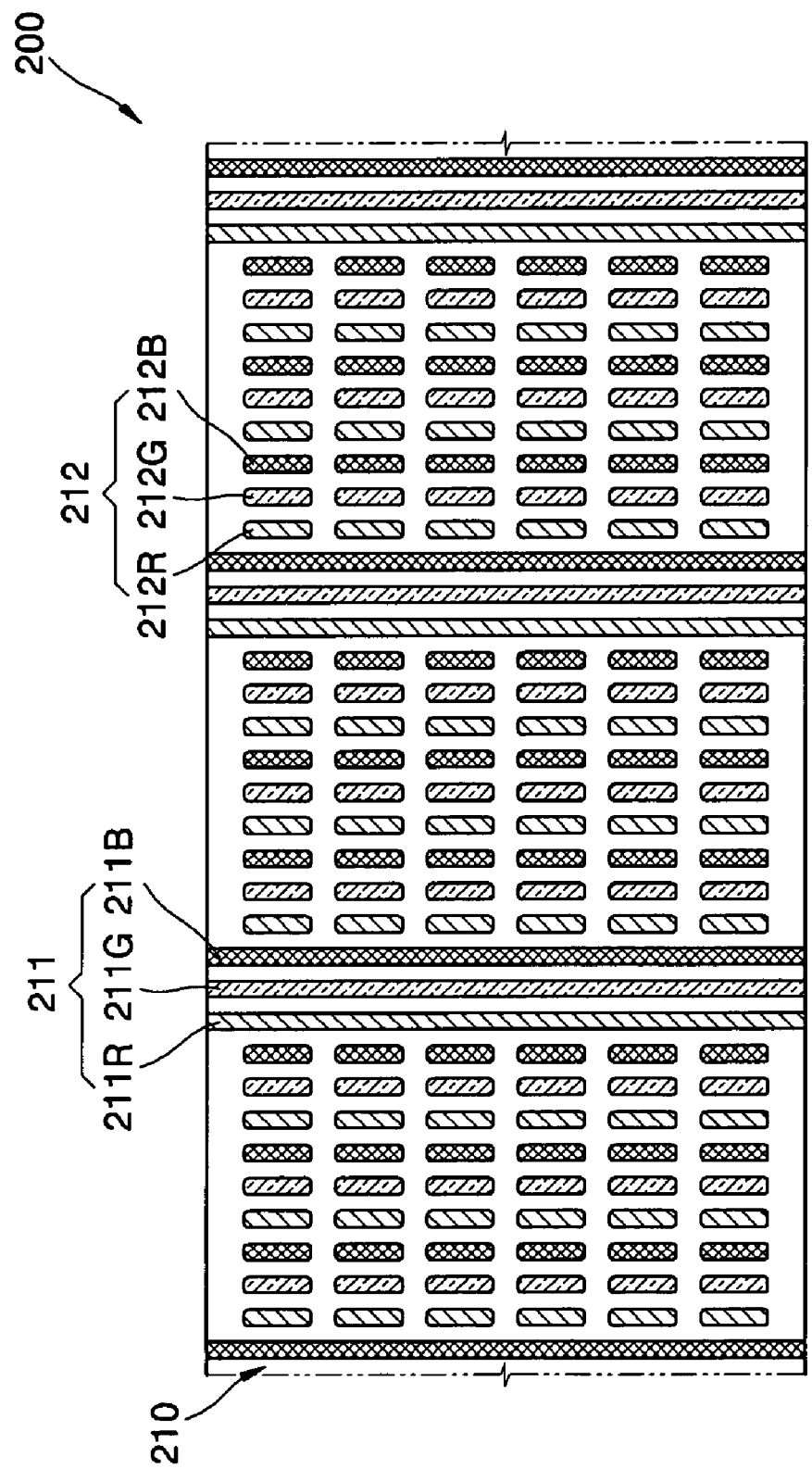
FIG. 9 is a plan view showing a pixel pattern of an OLED device according to an embodiment of the present invention.

FIG. 9 is a plan view showing a pixel pattern of an OLED device 200 formed by deposition.

The sub-pixels 210 of the OLED device 200 according to an embodiment of the present invention may include at least one stripe pattern 211 and a plurality of dot patterns 212.

A plurality of stripe patterns 211 separated a predetermined distance from each other may be formed, and the dot patterns 212 may be disposed between the stripe patterns 211.

In this structure, according to an embodiment of the present invention, the stripe patterns 211 may include a red stripe pattern 211R, a green stripe pattern 211G, and a blue stripe pattern 211B, and the dot patterns 212 may include a red dot pattern 212R, a green dot pattern 212G, and a blue dot pattern 212B.

The red stripe pattern 211R, the green stripe pattern 211G, and the blue stripe pattern 211B are arranged adjacent to each other, and groups of the red, green, and blue stripe patterns may be arranged repeatedly. The dot patterns 212 are arranged between the grouped stripe patterns 211.

Forming the sub-pixels 210 in this pattern may provide a very high precision pitch between pixels because the mask frame has high pitch precision for depositing. Therefore, a high quality display device may be manufactured since the pitch precision between the pixels is high even with a large scale display device.

The OLED device may be a passive matrix or active matrix device.

Figure 10:
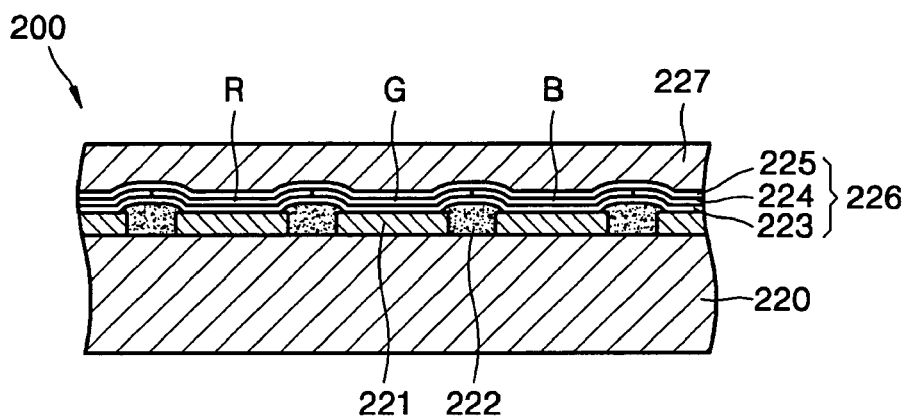
FIG. 10 is a cross-sectional view of a passive matrix OLED device according to an embodiment of the present invention.

FIG. 10 is a cross-sectional view showing a passive matrix OLED device in which a first electrode layer 221 is formed in a stripe pattern on a glass substrate 220, and an organic layer 226 and a second electrode layer 227 are sequentially formed on the first electrode layer 221. An insulating layer 222 may be interposed between the first electrodes 221, and the second electrode layer 227 may be formed in a pattern crossing the first electrode layer 221.

The organic layer 226 may be a low molecular weight organic layer or a polymer layer. If formed as a low molecular weight organic layer, a first organic layer 223, such as a Hole Injection Layer (HIL) and/or a Hole Transport Layer (HTL), an Emission Layer (EML) 224, and a second organic layer 225, such as an Electron Transport Layer (ETL) and/or an Electron Injection Layer (EIL), may be stacked in a single structure or a composite structure. The organic material may be copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film may be formed using a vacuum evaporation method.

If the organic layer 226 is formed of a polymer organic film, it may have a structure including the first organic layer 223, having a HTL, and the EML 224, and at this time, the second organic layer 225 may not be used. The HTL can be formed of PEDOT and the EML can be formed of Poly-Phenylenevinylene (PPV) and Polyfluorene. The polymer organic film may be formed by various methods including a screen printing method or an ink jet printing method.

The EML 224 of the organic layer 226 can emit the full color spectrum since it includes red R, green G, and blue B colors, and can form a pattern as shown in FIG. 9. Therefore, a high quality image may be displayed since the pattern has a high precision pitch.

The first electrode layer 221 may function as an anode, and the second electrode layer 227 may function as a cathode. Alternatively, the polarity of the first electrode layer 221 and the second electrode layer 227 may be reversed.

The first electrode layer 221 may be a transparent electrode or a reflection electrode. When the first electrode layer 221 is a transparent electrode, it may be formed of ITO, IZO, ZnO or $In_2O_3$, and when it is a reflection electrode, it may be formed of ITO, IZO, ZnO or $In_2O_3$ on a reflection film of Ag, Mg, Al, Pt, Pd, Au, Ni, Nd, Ir, Cr, or a compound of these metals.

The second electrode layer 227 may also be a transparent electrode or a reflection electrode. When the second electrode layer 227 is a transparent electrode, after forming an intermediate layer using a material having a low work function, such as Li, Ca, LiF/Ca, LiF/Al, Al, Ag, Mg, or a compound of these materials, an auxiliary electrode layer or a bus electrode line may be formed of a material for forming the transparent electrode, such as ITO, IZO, ZnO, or $InO_3$, on the intermediate layer. When the second electrode layer 227 is a reflection electrode, it may be formed by entirely depositing Li, Ca, LiF/Ca, LiF/Al, Al, Ag, Mg, or a compound of these metals.

Even though it is not shown, the OLED device is sealed to prevent oxygen or moisture penetration.

Figure 11:
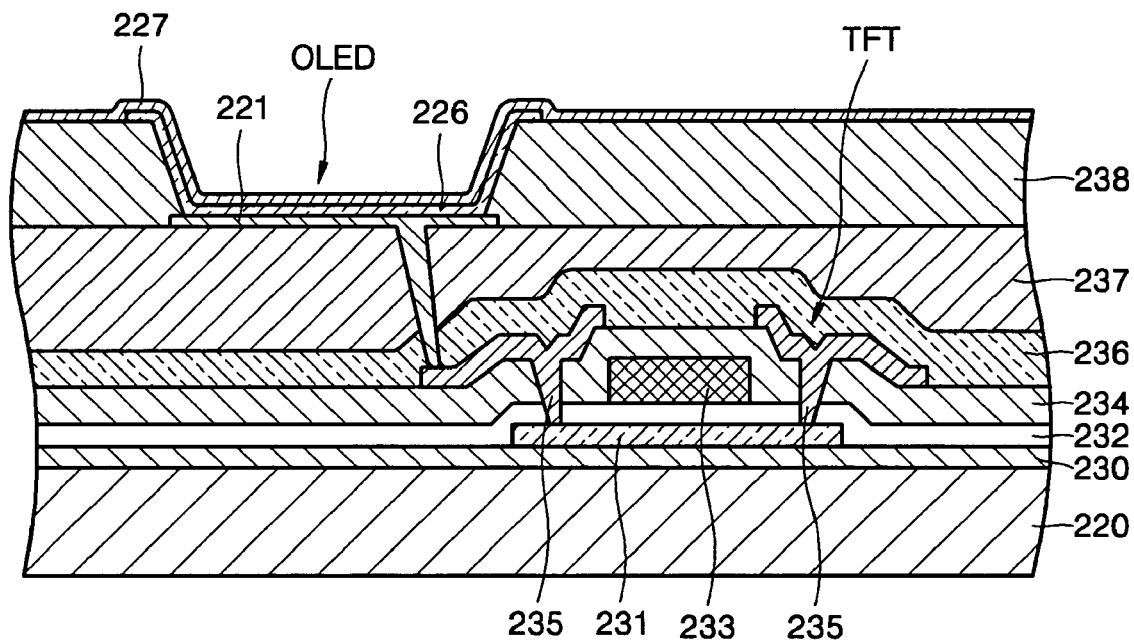
FIG. 11 is a cross-sectional view of an active matrix OLED device according to an embodiment of the present invention.

FIG. 11 is a cross-sectional view showing an active matrix OLED device according to an embodiment of the present invention. The sub-pixels in FIG. 11 include at least one thin film transistor (TFT) and an electroluminescent (EL) device (OLED device) which is a self emissive device.

The structure of the TFT is not limited to the structure shown in FIG. 11, as it may have various forms. The active matrix OLED device will now be described.

Referring to FIG. 11, a buffer layer 230, which may be formed of $SiO_2$ or SiNx, is formed on a glass substrate 220, and a TFT is arranged on the buffer layer 230.

The TFT includes a semiconductor active layer 231 formed on the buffer layer 230, a gate insulating film 232 covering the semiconductor active layer 231, and a gate electrode 233 formed on the gate insulating film 232. An interlayer insulating layer 234 covers the gate electrode 233, and source and drain electrodes 235 are formed on the interlayer insulating layer 234. The source and drain electrodes 235 contact a source region and a drain region, respectively, of the semiconductor active layer 231 through contact holes formed in the gate insulating film 232 and the interlayer insulating layer 234.

The semiconductor active layer 231 may be formed of an inorganic semiconductor or an organic semiconductor, and it includes a channel region that connects the source region and the drain region. The source region and the drain region of the semiconductor active layer 231 may be doped by an n-type or p-type dopant.

The inorganic semiconductor for forming the semiconductor active layer 231 may include, for example, CdS, GaS, ZnS, CdSe, CaSe, ZnSe, CdTe, SiC, and Si.

The organic semiconductor for forming the semiconductor active layer 231 may include, for example, organic semiconductor materials having a band gap of 1-4 eV, such as, polymers of polythiophene and its derivatives, polyparaphenylenevinylene and its derivatives, polyparaphenylene and its derivatives, polyflorene and its derivatives, polythiophenevinylene and its derivatives, polythiophene-heterocyclic aromatic polymeric and its derivatives, and low molecular weight molecules of pentacene, tetracene, alpha-6-thiophene, oligoacene of naphthalene and its derivatives, alpha-5-thiophene oligothiophene and its derivatives, phthalocyanine that does not include a metal and its derivatives, pyromelitic dianhydride and its derivatives, pyromelitic diimide and its derivatives, perylenetetracarboxylic acid dianhydride and its derivatives, and perylenetetracarboxylic diimide and its derivatives.

The gate insulating film 232 may be formed of $SiO_2$, SiNx, or a double film of $SiO_2$ and SiNx.

The gate electrode 233 is formed of a conductive material, such as MoW, Al, Cr, Al/Cu, or a conductive polymer. A region on the gate insulating film 232 in which the gate electrode 233 is formed corresponds to the channel region of the semiconductor active layer 231.

The interlayer insulating layer 234 may be formed of $SiO_2$, SiNx, or a compound of these materials, and the source and drain electrodes 235 may be formed of the same material forming the gate electrode 233.

A passivation film 234, which may be formed of $SiO_2$ or SiNx, is formed on the source and drain electrodes 235, and a planarizing film 237, which may be formed of acryl or polyimide, is formed on the passivation film 234.

Even though it is not shown in the drawing, at least one capacitor is coupled to the TFT.

The first electrode layer 221, which functions as an anode of an OLED device, is coupled to one of the source and drain electrodes 235. The first electrode layer 221 is formed on the planarizing film 237, and a pixel defining layer 238 covering the first electrode layer 221 is formed on the planarizing film 237. After forming a predetermined opening in the pixel defining layer 238 to expose a portion of the first electrode layer 221, an OLED device is formed.

The OLED device displays a predetermined image by emitting red, green, or blue light according to the current flow, and it includes the first electrode layer 221 that receives a positive voltage from the source or drain electrode 235, a second electrode layer 227 that supplies negative power and covers the pixels, and an organic layer 226 arranged between the first electrode layer 221 and the second electrode layer 227 to emit light.

The description of the organic layer 226 is omitted since the organic layer may have the same structure as the organic layer 226 of FIG. 10. In an active matrix OLED device, a high precision display device may be realized by arranging the EML 224 of the organic layer 226 as the pixels disposed in FIG. 9.

The first electrode layer 221 may be formed of a transparent electrode or a reflective electrode, like the passive matrix OLED, to correspond to the opening shape of each sub-pixel. Also, the second electrode layer 227 may be formed by depositing a transparent electrode or a reflective electrode on the entire surface of the display region. Alternatively, the second electrode layer 227 may be formed in various patterns. The positions of the first electrode layer 221 and the second electrode layer 227 may be reversed.

The OLED device is sealed to prevent oxygen or moisture penetration.

The mask frame assembly for depositing a thin film according to embodiments of the present invention may increase the precision of a total pitch of a pattern of the masking pattern unit and may reduce the deformation of the pattern due to heat.

The deposition on a large display area may be possible since gaps between the unit masks may be used as a pattern.

A display device manufactured using the mask frame assembly may provide a high precision pitch between the pixels and display a high quality image.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A mask frame assembly for depositing a thin film, comprising:
    at least two unit masks, ends of the unit masks being coupled to a frame having an opening,
    wherein each unit mask includes a plurality of deposition openings,
    wherein a first gap having a width substantially equal to a width of the deposition openings is located between the unit masks,
    wherein portions of the unit masks adjacent to the deposition openings and the first gap have a sloped taper,
    wherein cross-sectional structures of the deposition openings and the first gap are the same, and
    wherein the first gap is located along the whole length of the unit mask disposed over the opening of the frame.

2. The mask frame assembly of claim 1, wherein a second gap having a width substantially equal to the width of the deposition openings is located between an outermost unit mask of the unit masks and the frame.

3. The mask frame assembly of claim 2, wherein the deposition openings, the first gap, and the second gap form a masking pattern unit.

4. The mask frame assembly of claim 2, wherein the second gap extends along a length direction of the unit masks.

5. The mask frame assembly of claim 4, wherein the second gap has a length that is substantially equal to a length of a portion of a unit mask exposed in the opening of the frame.

6. The mask frame assembly of claim 1, wherein the deposition openings and the first gap form a masking pattern unit.

7. The mask frame assembly of claim 1, wherein the deposition openings are arranged overlapping with the opening of the frame.

8. The mask frame assembly of claim 1, wherein the first gap extends along a length direction of the unit masks.

9. The mask frame assembly of claim 1, wherein the deposition openings comprise discontinuous dot patterns.

10. The mask frame assembly of claim 1, wherein the deposition openings comprise continuous stripe patterns.

* * * * *